US010393792B1

(12) United States Patent
Yang et al.

(10) Patent No.: US 10,393,792 B1
(45) Date of Patent: Aug. 27, 2019

(54) ELECTRONIC CIRCUIT WITH CONNECTION ERROR INDICATION FUNCTION

(71) Applicant: Eaton Intelligent Power Limited, Dublin (IE)

(72) Inventors: Lin Yang, Jianhsu (CN); Tao Xiong, Shanghai (CN); Chuanchuan Zhuang, Shanghai (CN); Guiquan Lu, Dongguan (CN); Fengguo Zhang, Shanghai (CN)

(73) Assignee: Eaton Intelligent Power Limited, Dublin (IE)

( * ) Notice: Subject to any disclaimer, the term of this patent is extended or adjusted under 35 U.S.C. 154(b) by 16 days.

(21) Appl. No.: 15/913,020

(22) Filed: Mar. 6, 2018

(51) Int. Cl.
| | | |
|---|---|---|
| *G01R 31/04* | (2006.01) | |
| *H01R 13/717* | (2006.01) | |
| *H01R 24/76* | (2011.01) | |
| *H01R 103/00* | (2006.01) | |
| *H01R 24/68* | (2011.01) | |

(52) U.S. Cl.
CPC ........ *G01R 31/045* (2013.01); *H01R 13/7175* (2013.01); *H01R 24/68* (2013.01); *H01R 24/76* (2013.01); *H01R 2103/00* (2013.01); *H01R 2201/20* (2013.01)

(58) Field of Classification Search
CPC .. G01R 31/045; H01R 24/68; H01R 2103/00; H01R 24/76; H01R 13/7175; H01R 2201/20
USPC ............................................ 324/66, 426, 508
See application file for complete search history.

(56) References Cited

U.S. PATENT DOCUMENTS

| | | | |
|---|---|---|---|
| 3,952,244 | A | 4/1976 | Spear |
| 5,625,285 | A | 4/1997 | Virgilio |
| 6,977,507 | B1 | 12/2005 | Pannell et al. |
| 7,839,133 | B2 | 11/2010 | Blanchard |
| 8,866,485 | B1 | 10/2014 | Lacey et al. |
| 9,671,466 | B2 * | 6/2017 | Murahari ........... G01R 31/3275 |

OTHER PUBLICATIONS

"What the Outlet Tester Means Interpreting 3-Prong Receptacle Testers", The Circuit Detective, http://www.thecircuitdetective.com/outlet_tester_readings.htm, downloaded Sep. 27, 2017.

* cited by examiner

*Primary Examiner* — Farhana A Hoque
(74) *Attorney, Agent, or Firm* — Fox Rothschild LLP

(57) ABSTRACT

An electrical outlet device includes a connection circuit having neutral, hot and ground terminals that are configured to be connected to a corresponding line of a power source. The device also includes an interface panel with a receptacle configured to receive a load. An indicator interface device is attached to the interface panel. The indicator interface device includes at least three sets of light-emitting diodes (LEDs), and at least three switching circuits that are configured to turn the LED sets on and off. At least one combination of on/off states of the first, second and third LED sets indicates a correct connection or a unique type of error in a connection between the power source and the connection circuit.

20 Claims, 7 Drawing Sheets

ELECTRONIC CIRCUIT WITH CONNECTION ERROR INDICATION FUNCTION

BACKGROUND

Electronic circuits must operate in a variety of environments and devices to deliver power to a load. When a load is embodied in a portable device, or when a load is connected to a power source in a rough environment that is subject to vibration, temperature variation or other external factors, the connection of the conductors between the load and a power source may become loose or interrupted. In addition, if the connection between the load and power source is improperly wired, the load will not function and/or may be damaged.

Two-prong and three-prong power receptacle testers exist to test the operation of standard wall outlet plugs. However, such testers require a user to disconnect the load and to connect the tester to a receptacle. In addition, such testers do not proactively alert maintenance personnel to potential wiring connection issues in power outlet devices that are designed to deliver power to a load. Certain testers use neon bulbs or other electrical components that can drive up the cost of the testers.

This document describes a circuit that is designed to address at least some of the problems described above.

SUMMARY

In a first aspect, an electronic outlet device includes a connection circuit having a neutral terminal, a hot terminal and a ground terminal, in which each of the terminals connects to a neutral line of a power source, a hot line of the power source, or ground. The electronic outlet device also includes an interface panel that has a receptacle connected to the connection circuit and configured to receive a load. An indicator interface device is attached to the interface panel. The indicator interface device includes a neutral conductor, a hot conductor and a ground conductor respectively connected to the neutral terminal, the hot terminal and the ground terminal of the connection circuit. The indicator interface also includes a first indicator circuit connected between the neutral conductor and the ground conductor. The first indicator circuit includes a first light-emitting diode (LED) set that includes one or more LEDs, as well as a first switching circuit configured to cause the one or more LEDs in the first LED set to turn on and off. The indicator interface also includes a second indicator circuit connected to the neutral conductor. The second indicator circuit includes a second LED set with one or more LEDs, as well as a second switching circuit configured to cause the one or more LEDs in the second LED set to turn on and off, The indicator interface also includes a third indicator circuit connected between the second indicator circuit and the hot conductor and also connected between the ground conductor and the hot conductor. The third indicator circuit includes a third LED set with one or more LEDs, as well as a third switching circuit configured to cause the one or more LEDs in the third LED set to turn on and off. At least one combination of on/off states of the first, second and third LED sets indicates a correct connection or a unique type of error in a connection between the power source and the connection circuit.

In some embodiments, the correct connection may include the hot terminal. In addition, the neutral terminal and the ground terminal of the connection circuit may respectively connect to the hot line, the neutral line and the ground of the power source. If so, the unique type of error in the connection may include one of the following connections: (i) the hot terminal of the connection circuit is open; (ii) the neutral terminal of the connection circuit is open; (iii) the ground terminal of the connection circuit is open; (iv) the hot and ground terminals of the connection circuit are respectively connected to the ground and the hot line of the power source; or (iv) the hot and neutral terminals of the connection circuit are respectively connected to the neutral and hot lines of the power source.

In some embodiments, the one or more LEDs in the first LED set may be connected in series so that a current flow in a first direction from the ground conductor to the neutral conductor will cause the one or more LEDs in the first LED set to emit light. In these embodiments, the first switching circuit may include a rectifier connected to the first LED set in series and configured to limit current flow in the first indicator circuit in the first direction. Optionally, the first switching circuit may further include a limiter connected to the rectifier in series and configured to limit an amplitude of the current flow in the first indicator circuit to protect the one or more LEDs in the first LED set.

In some embodiments, the one or more LEDs in the second LED set may be connected in series so that a current flow in a second direction from the neutral conductor to the hot conductor will cause the one or more LEDs in the second LED set to emit light. In these embodiments, the second switching circuit may include a rectifier that is connected to the second LED set in series and configured to limit current flow in the second indicator circuit in the second direction. Optionally, the second switching circuit may further include a limiter connected to the rectifier in series and configured to limit an amplitude of the current flow in the second indicator circuit to protect the one or more LEDs in the second LED set.

In some embodiments, the one or more LEDs in the third LED set may be connected in series so that a current flow in a third direction will cause the one or more LEDs in the third LED set to emit light. In these embodiments, the third switching circuit may include a voltage regulator and a capacitor connected in parallel. Also, the voltage regulator and the capacitor together may be connected to the third LED set in parallel, and configured to stabilize a voltage across the third LED set when there is a current flow in the third direction in the third indicator circuit.

In some embodiments, the third switching circuit may include a rectifier connected to the ground conductor to limit a current flow in the third switching circuit in a fourth direction from the ground conductor to the hot conductor. The third switching circuit may include a transistor having a base, a collector and an emitter, with the emitter connected to the third LED set. The collector may be connected to the hot conductor. A resistor may be connected between the collector and the base of the transistor The third switching circuit may be configured to allow the transistor to switch on a current flow through the third LED set when there is no current flow in the fourth direction in the third switching circuit, and to allow the transistor to switch off the current flow through the third LED set when there is a current flow in the fourth direction in the third switching circuit. In addition, the third switching circuit may further include a capacitor connected between the collector and base of the transistor to stabilize a voltage between the collector and the base of the transistor.

In another aspect, an indicator interface device for testing an electrical outlet includes a three-prong input pluggable into a receptacle of the electrical outlet. The three-prong input has a neutral conductor, a hot conductor and a ground conductor. The receptacle is connected to a power source via a connection circuit. A first indicator circuit may be connected between the neutral conductor and the ground conductor. The first indicator circuit may include a first light-LED set with one or more LEDs, and a first switching circuit configured to cause the first LED set to turn on and off. A second indicator circuit may be connected to the neutral conductor. The second indicator circuit may include: a second LED set with one or more LEDs; a second switching circuit configured to cause the second LED set to turn on and off; and a third indicator circuit connected between the second indicator circuit and the hot conductor and also connected between the ground conductor and the hot conductor. The third indicator circuit may include a third LED set with one or more LEDs, and a third switching circuit configured to cause the second LED set to turn on and off. A combination of an on/off state of the first, second and/or third LED sets will indicate a correct connection or a unique type of error in a connection between the power source and the connection circuit.

In some embodiments, the connection circuit may include a hot terminal, a neutral terminal and a ground terminal. The correct connection may include the hot terminal, the neutral terminal and the ground terminal of the connection circuit being respectively connected to a hot line, a neutral line and ground of the power source. The unique type of error in the connection may include one of the following connections: the hot terminal of the connection circuit is open; the neutral terminal of the connection circuit is open; the ground terminal of the connection circuit is open; the hot and ground terminals of the connection circuit are respectively connected to the ground and the hot line of the power source; or the hot and neutral terminals of the connection circuit are respectively connected to the neutral and hot lines of the power source.

In some embodiments, the one or more LEDs in the first LED set may be connected in series so that a current flow in a first direction from the ground conductor to the neutral conductor will cause the one or more LEDs in the first LED set to emit light. The first switching circuit may include a rectifier connected to the first LED set in series and configured to limit current flow in the first indicator circuit in the first direction. The first switching circuit may further include a limiter connected to the rectifier in series and configured to limit an amplitude of the current flow in the first indicator circuit to protect the one or more LEDs in the first LED set.

In some embodiments, the one or more LEDs in the second LED set may be connected in series so that a current flow in a second direction from the neutral conductor to the hot conductor will cause the one or more LEDs in the second LED set to emit light. The second switching circuit may include a rectifier connected to the second LED set in series and configured to limit current flow in the second indicator circuit in the second direction. The second switching circuit may further include a limiter connected to the rectifier in series and configured to limit an amplitude of the current flow in the second indicator circuit to protect the one or more LEDs in the second LED set.

In some embodiments, the one or more LEDs in the third LED set may be connected in series so that a current flow in a third direction will cause the one or more LEDs in the third LED set to emit light. The third switching circuit may include a voltage regulator and a capacitor connected in parallel. In addition, the voltage regulator and the capacitor together may be connected to the third LED set in parallel, and configured to stabilize a voltage across the third LED set when there is a current flow in the third direction in the third indicator circuit.

In some embodiments, the third switching circuit may include a rectifier connected to the ground conductor to limit a current flow in the third switching circuit in a fourth direction from the ground conductor to the hot conductor. The third switching circuit may further include a transistor having a base, a collector and an emitter, with the emitter connected to the third LED set. The collector may be connected to the hot conductor. A resistor may be connected between the collector and the base of the transistor. The third switching circuit may be configured to allow the transistor to switch on a current flow through the third LED set when there is no current flow in the fourth direction in the third switching circuit, and to allow the transistor to switch off the current flow through the third LED set when there is a current flow in the fourth direction in the third switching circuit. The third switching circuit may further include a capacitor connected between the collector and base of the transistor to stabilize a voltage between the collector and the base of the transistor.

DETAILED DESCRIPTION

As used in this document, the singular forms "a," "an," and "the" include plural references unless the context clearly dictates otherwise. Unless defined otherwise, all technical and scientific terms used herein have the same meanings as commonly understood by one of ordinary skill in the art. As used in this document, the term "comprising" (or "comprises") means "including (or includes), but not limited to."

In this document, when terms such as "first," "second," "third," "fourth," "fifth" and so on are used to modify a noun, such use is simply intended to distinguish one item from another, and is not intended to require a sequential order unless specifically stated.

In this document, unless other stated, the term "electrically connected" or "connected" as used in electrically connecting two components refers to forming a path between the two components so that electrical current may flow through. Two components that are electrically connected may be physically connected by conductors directly, or may be indirectly connected. The term "component" refers to any device that may facilitate an electrical current path. Examples of a component may include a conductor, a resistor, a capacitor, an inductor, a transistor, or any other electrical components, a circuit or an electronic device.

Figure 1A:
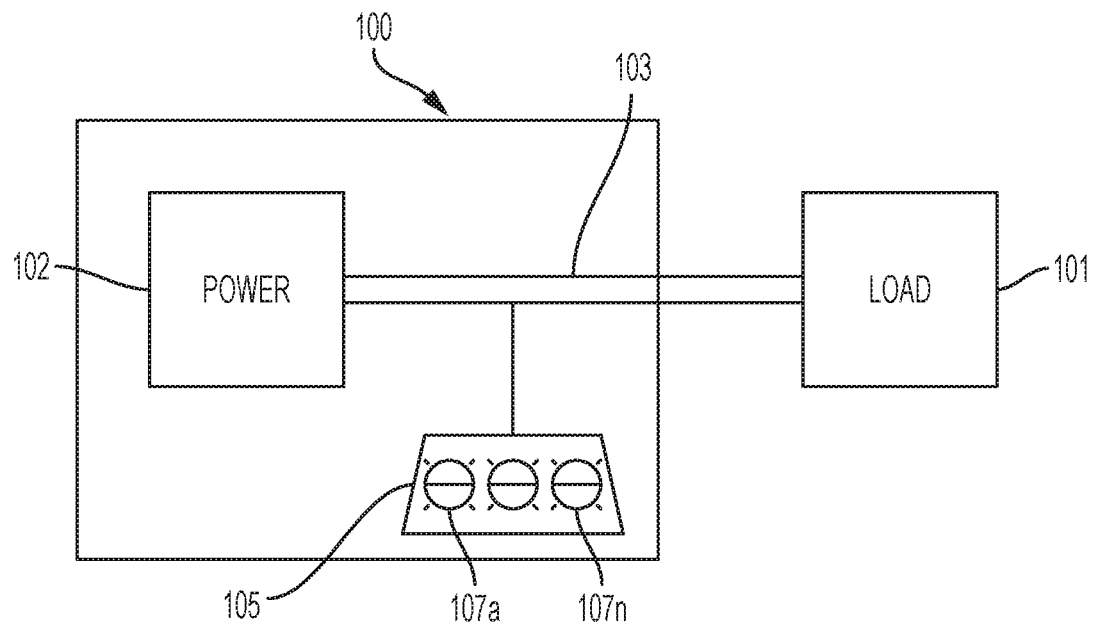
FIGS. 1A-1B illustrate block diagrams showing an example indication interface device in various configurations in a power outlet system.

FIG. 1A shows a block diagram, in which an electronic indicator interface device 105 is integrated into a power outlet system 100 that has a connection circuit 103 for connecting a power source 102 to a load 101. Power source 102 may include a hot line, a neutral line and a ground. The hot line and neutral line are provided by the feed from the power grid. The ground may also be provided by the feed from the power grid. Alternatively, the ground may be electrically connected to an earth ground, for example, via a metal rod, and installed as part of the power source at the premises of the building in which the power outlet system 100 is installed.

Connection circuit 103 may include three input conductors: (i) line (or hot) terminal, which transfers alternating current (AC) from the power source to the load; (ii) neutral terminal, which provides a return path for current to the power source; and (iii) ground terminal, which is electrically connected to an earth ground or the ground of the power source. Each terminal may be made of any conductive material, such as a metal-containing busbar or wire, a conductive trace or other conductive elements. Each of the hot, neutral and ground terminals of connection circuit 103 is connected to one of the hot line, the neutral line and ground of power source 102, so that the connection circuit will transfer AC from the power source 102 to the load 101.

Electronic indicator interface device 105 is configured to connect to the connection circuit 103 and may have a display that indicates whether the connection circuit is physically connected to the power source correctly. The display may include one or more indicator lighting devices 107a . . . 107n, such as light emitting diodes (LEDs) that exhibit different sizes, shapes or colors, to uniquely identify types of connection errors, which will be described later in this document.

As shown in FIG. 1A, the indicator interface device 105 may be built-in inside a power outlet, for example, behind or inside a wall, while the one or more indicating lighting devices are visible to a user so that the user can readily tell whether the power outlet is correctly connected to the power source before plugging a load to the outlet. This will not require the user to use a tester to plug into the outlet. In some scenarios, the power outlet system may have an interface panel, for example, a wall plate, that has a receptacle for receiving a load, where the receptacle is connected to the connection circuit of the power outlet for transferring the AC power to the load. The interface panel may also have a display that shows the one or more lighting indicating devices 107a . . . 107n of the indicator interface device 105. Depending on the connection between the connection circuit 103 and the power source 102, the one or more lighting indicating devices may be on or off variably, and a combination of the on/off state of one or more lighting indicating devices may be used to indicate various errors of connections, which will be further described later in this document.

Figure 1B:
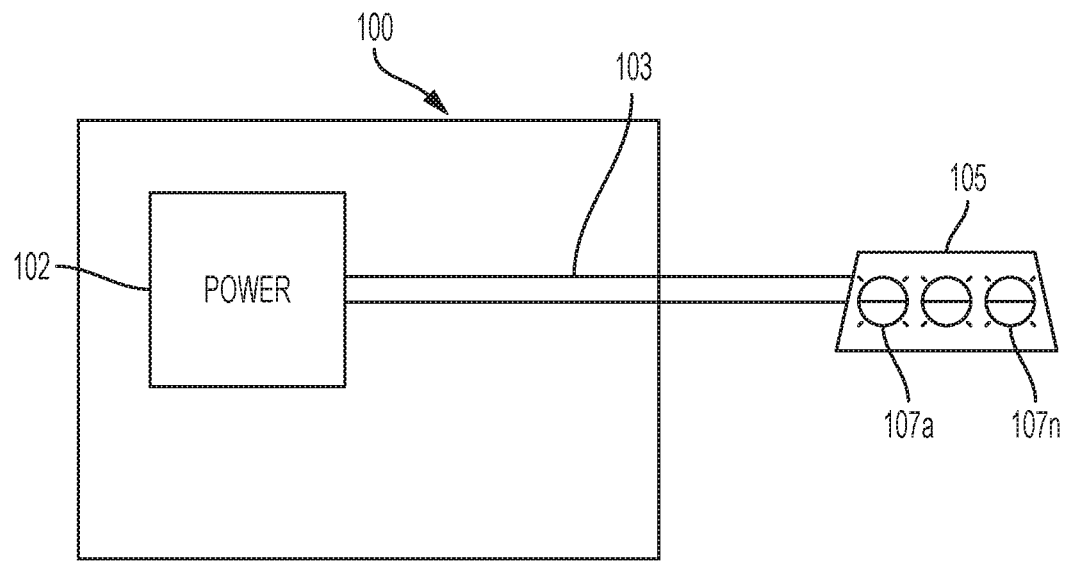

In FIG. 1B, in an alternative configuration, the indicator interface device 105 may be external to the power outlet system 100. For example, the indicator interface device 105 may be configured as a testing device that has a three-prong input pluggable into an electrical outlet 100 and the one or more lighting indicating devices 107a . . . 107n. When indicator interface device 105 is plugged into the power outlet, a combination of the on/off states of one or more lighting indicating devices may be used to indicate various errors of connections, which will be further described later in this document. In another non-limiting example, the indicator interface device 105 may be an integrated part of a load 101. For example, a load may be a single electronic device, such as a power tool, a lighting device, or other device having a load that consumes power from an internal battery or external power source. When the load is plugged into a power outlet, the one or more lighting devices of the indicator interface device 105 may indicate whether the power outlet is correctly connected, thus, whether the load is safe to use. The structure of the indicator interface device 105 is further explained in detail with reference to FIG. 2.

Figure 2:
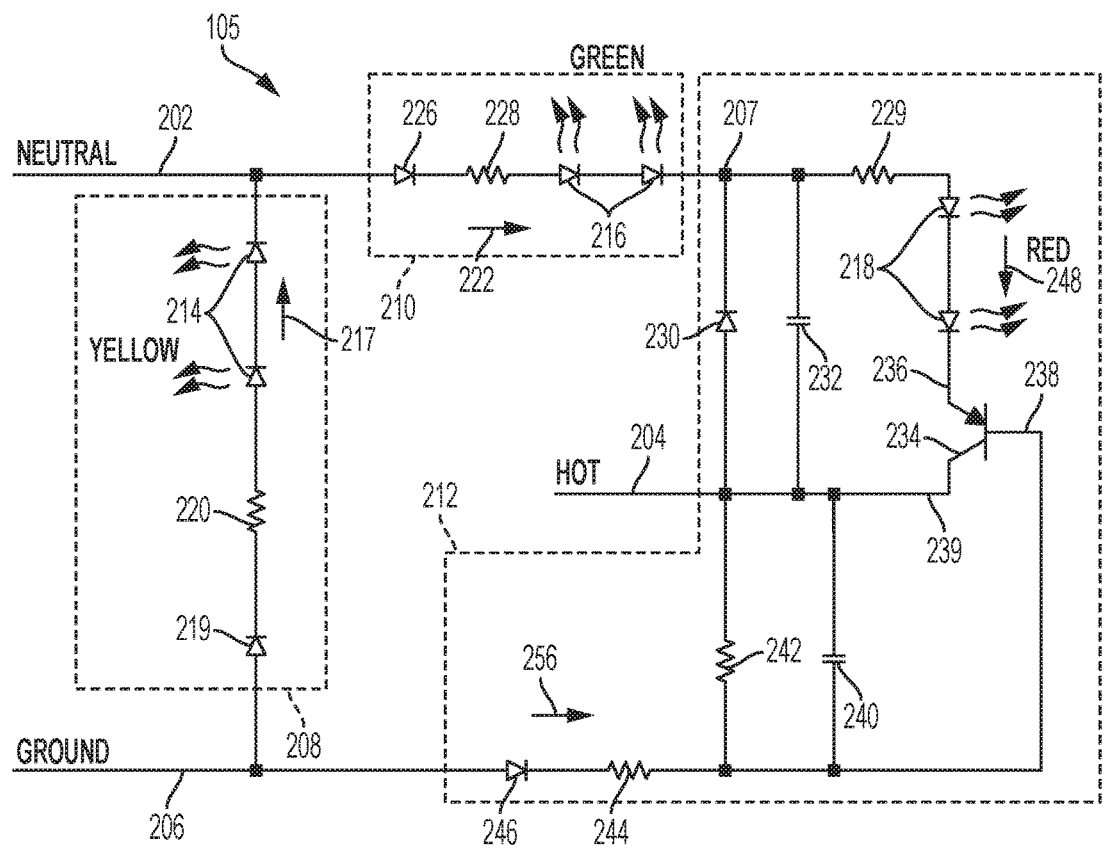
FIG. 2 illustrates the structure of the example indication interface device in FIGS. 1A-1B.

In FIG. 2, in some scenarios, an indicator interface device may include three conductors: the neutral conductor 202, the hot conductor 204 and the ground conductor 206 for respectively connecting to the neutral, hot and ground terminals of the connection circuit (103 in FIG. 1). The device 105 also includes a first indicator circuit 208 connected between the neutral conductor 202 and the ground conductor 206. The first indicator circuit 208 includes a first LED set comprising one or more LEDs 214 and a first switching circuit configured to cause the first LED set to turn on and off. In some scenarios, the one or more LEDs 214 in the first LED set are connected in series so that a current flow in a first direction 217 from the ground conductor 206 to the neutral conductor 202 will cause one or more LEDs in the first LED set 214 to emit light. The first switching circuit may include a rectifier 219 (e.g., a diode) connected to the first LED set 214 in series and configured to limit current flow in the first indicator circuit in the first direction 217. The first switching circuit may also include a limiter 220 (e.g., a resistor) connected to the rectifier 219 in series and configured to limit amplitude of the current flow in the first indicator circuit to protect one or more LEDs in the first LED set 214.

Indicator interface device 105 may further include a second indicator circuit 210 connected to the neutral conductor 202. The second indicator circuit 210 may include a second LED set that includes one or more LEDs 216, and a second switching circuit configured to cause the second LED set to turn on and off. In some scenarios, one or more LEDs in the second LED set 216 are connected in series so that a current flow in a second direction 222 from the neutral conductor 202 to the hot conductor 204 will cause one or more LEDs in the second LED set 216 to emit light. The second switching circuit may include a rectifier 226 (e.g., a diode) connected to the second LED set 216 in series and configured to limit current flow in the second indicator circuit in the second direction 222. The second switching circuit may also include a limiter 228 (e.g., a resistor) connected to the rectifier 226 in series and configured to limit the amplitude of the current flow in the second indicator circuit to protect the one or more LEDs in the second LED set 216.

Indicator interface device 105 may further include a third indicator circuit 212 connected between the second indicator circuit 210 and the hot conductor 204 and also connected between the ground conductor 206 and the hot conductor 204. The third indicator circuit includes a third LED set comprising one or more LEDs 218 and a third switching circuit configured to cause the third LED set 218 to turn on and off. In some scenarios, one or more LEDs in the third LED set 218 are connected in series so that a current flow in a third direction 248 will cause one or more LEDs in the third LED set 218 to emit light. The third indicator circuit 212 is connected to the second indicator circuit 210 at a connection point 207. The third switching circuit 212 may include a resistor 229 connected between the connection point 207 and the third LED set 218 and configured to limit the current flow through the third LED set 218 to protect the one or more LEDs in the third LED set 218. The third switching circuit 212 may also include a voltage regulator 230 (e.g., a Zener diode) and a capacitor 232 connected in parallel between the connect point 207 and the hot conductor 204. Zener diode 230 and capacitor 232 are together further connected to the third LED set 218 in parallel, and configured to stabilize the voltage across the third LED set 218 when there is a current flow in the third direction 248.

The third switching circuit further includes a transistor 234 having a base 238, a collector 239 and an emitter 238, with the emitter being connected to the third LED set 248 and the collector 239 being connected to the hot conductor 204, and a resistor 242 being connected between the collector 239 and the base 238. The third switching circuit also includes a rectifier 246 (e.g., a diode) connected to the ground conductor 206 to limit a current flow in a fourth direction 256 to protect the third switching circuit. When there is no current flow in the fourth direction 256, the third switching circuit is configured to cause the transistor 234 to switch on to allow the current flow 248 through the third LED set 218 to cause the third LED set 218 to emit light. When there is a current flow in the fourth direction 256, the third switching circuit is configured to cause the transistor 234 to switch off, preventing current flow through the third LED set 218 and causing the third LED set to be off.

In some scenarios, the third switching circuit may further include a capacitor 240 connected between the collector 239 and the base 238 of the transistor to stabilize voltage between the collector 239 and the base 238. The third switching circuit may further include a resistor 244 connected to the rectifier 246 and configured to limit the amplitude of the current flow in the fourth direction 256 to protect the third indicator circuit 212.

The above illustrated various embodiments of the indicator interface device 105 in FIG. 2 will cause the first, second and third LED sets to turn on and off under various connection conditions between the connection circuit and the power source so that one of a combination of an on/off state of the first, second and third LED sets indicates a correct connection or a unique type of error in a connection between the power source and the connection circuit. The LED sets may exhibit three different colors, although the combination of colors shown in FIG. 2 (red, green and yellow) is only an example, as any combination of colors may be used. An example of a mapping between the states of various LED sets and the corresponding connection errors (or no error) is listed in the table below. Each of the conditions is further explained in detail with reference to FIGS. 3-7.

| State of LED sets | | | Error/No error condition | Description of conditions |
|---|---|---|---|---|
| 1st set | 2nd set | 3rd set | | |
| OFF | ON | OFF | Correct | The hot terminal is connected to the hot line of the power source; the neutral terminal is connected to the neutral line of the power source; and the ground terminal is connected to the ground of the power source. |
| OFF | ON | ON | Open ground | Ground terminal of the connection circuit is not connected. |
| ON | ON | OFF | Open neutral | Neutral terminal of the connection circuit is not connected. |
| OFF | OFF | OFF | Open hot | Hot terminal of the connection circuit is not connected. |
| ON | ON | ON | Hot/Neutral reverse | The hot terminal is connected to the neutral line of the power source, and the neutral terminal of the connection circuit is connected to the hot line of the power source. |
| ON | OFF | OFF | Hot/Ground reverse | The hot terminal is connected to the ground of the power source, and the ground terminal of the connection circuit is connected to the hot line of the power source. |

Figure 3:
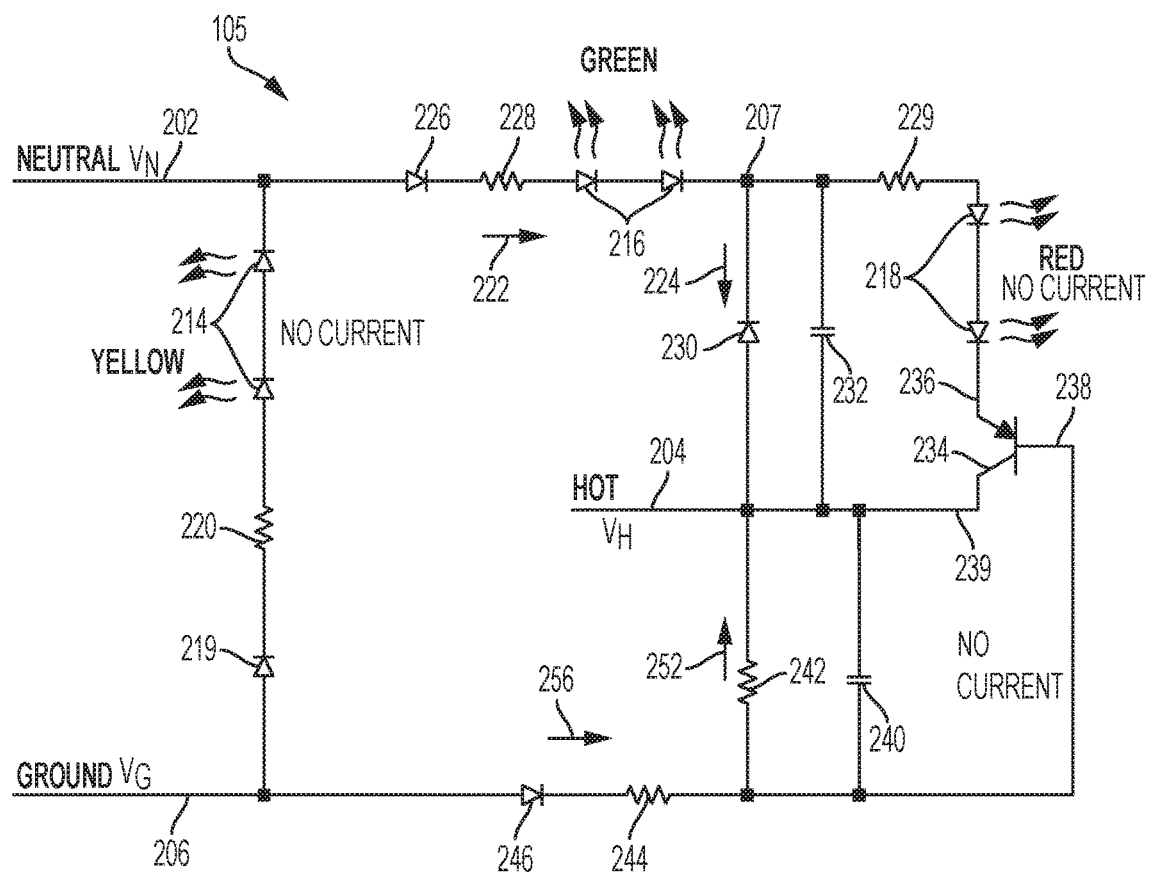
FIG. 3 illustrates features of the example indication interface device in FIGS. 1A-1B when all of the connections are correct.

In FIG. 3, when all of the conductors 202, 204 and 206 are respectively connected to the neutral, hot and ground terminals of the connection circuit correctly, there will be no voltage across the neutral conductor 202 and the ground conductor 206, thus, there is no current flow through the first LED set 214, causing the first LED set 214 to be off. The AC current provided from the power source is a sinusoid (sine) wave that periodically reverses direction. Each cycle of the sine wave has two half cycles: one starts from the valley to the peak of the sine wave; and the other from the peak to the valley. Depending on which half of the AC cycle that the power source current is in, the voltage at the hot conductor 204, $V_H$, may be higher or lower than the voltage at the neutral conductor 202, $V_N$, and the voltage at the ground conductor 206, $V_G$. When $V_H > V_G$ and $V_H > V_N$, there will be no current flowing through the second LED set 216 due to rectifier 226. There is no current flow in rectifier 246 and the first LED set 214 either. When $V_H < V_G$ and $V_H < V_N$, current will flow in the direction 222, 224, and 256, 252.

With further reference to FIG. 3, the current flow in 222 causes the second LED set 216 to be on. Current flow 252 through the resistor 242 causes a voltage drop across the resistor 242, which may cause the voltage at the base 238 to be higher than the voltage at the emitter 236 of the transistor 234. For example, the resistance value of the resistor 252 may have a value at a few hundred kilo-ohms, which may result in a significant voltage drop across the resistor due to the current 252. Such a voltage drop may reach a value of around 20 volts. In comparison, the current in the direction 224 causes a voltage across the voltage regulator 230, such voltage may be as low as 10 volts or lower. This condition causes the transistor 234 to switch off, thus, there is no current flow through the third LED set 218, causing the third LED set to be off.

As described above, the second LED set 216 is turned on only during half of each cycle of the AC current of the power source when $V_H < V_G$ and $V_H < V_N$. However, because the AC current alternates direction at 50-60 Hz, such alternation of direction is too fast to be noticeable by a human being, thus the second LED set appears on steadily to the human eye.

Figure 4:
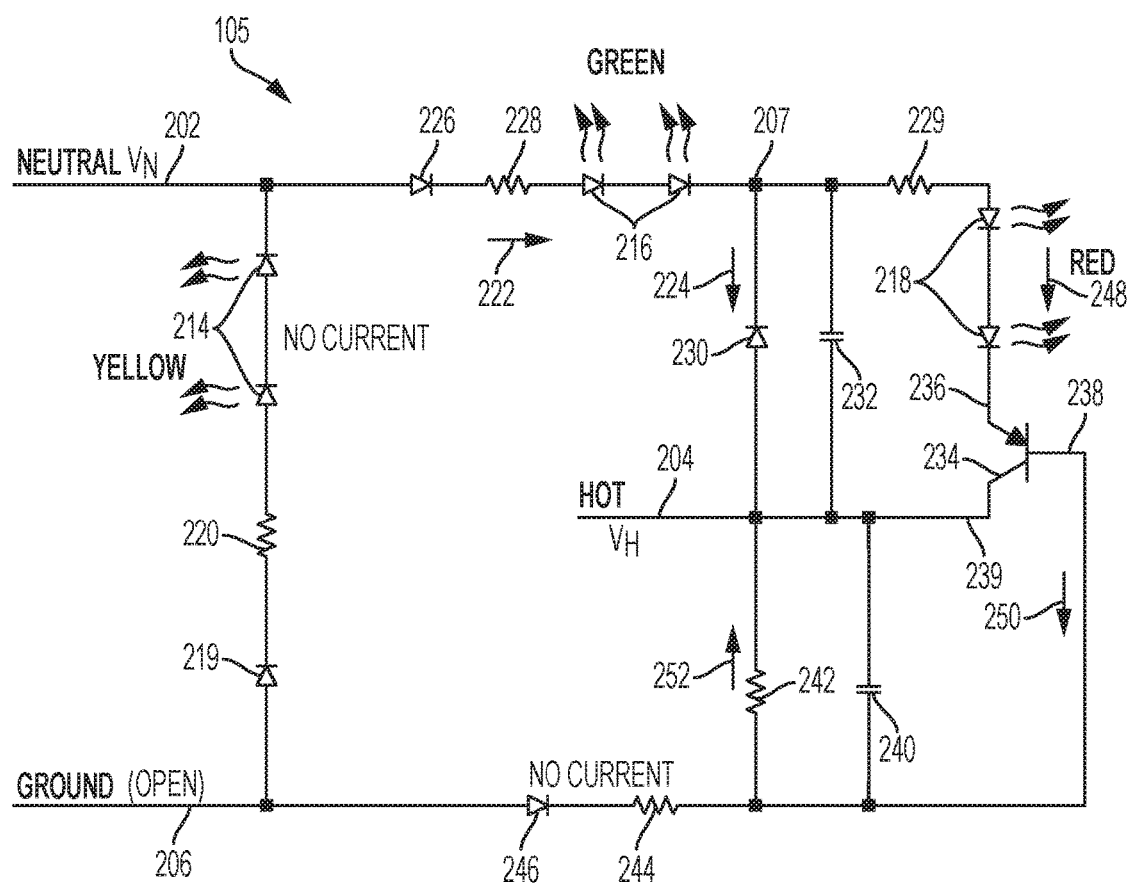
FIG. 4 illustrates features of the example indication interface device in FIGS. 1A-1B when the ground is open.

In FIG. 4, the ground conductor 106 is not connected. At each half cycle of the AC current of the power source, the voltage at the neutral conductor 202, $V_N$, may be greater or less than the voltage at the hot conductor 204, $V_H$. When $V_H > V_N$, there will be no current flowing through the first LED set 216 due to rectifier 226. There will also be no current flowing through the rectifier 246 either. When $V_H<V_N$, the hot conductor 204 has the lowest voltage in the circuit, causing a current flowing through the second LED set 216 in the direction 222, this causes the second LED set 216 to be on. The current 222 continues to flow through the Zener diode 230 in the direction 224 to cause a voltage across the Zener diode 230. This voltage across the Zener 230 ranges in less than 10 volts at the connection point 207 relative to $V_H$. There is no current from the neutral conductor 202 to ground to rectifier 246 due to the rectifier 219.

When there is no current flowing through the rectifier 246, the current flowing in direction 252 is from the current 250 flowing from the base 238 of the transistor 234 alone. This small current in the direction 252 causes a small voltage across the resistor 242, which causes the voltage at the base 238 of the transistor to be less than the voltage of the emitter 236. In some scenarios, the voltage at the base may be near 1 volt, whereas the voltage at the emitter 236 may be several volts to less than 10 volts relative to $V_H$. This voltage difference at the emitter 236 and the base 238 causes the transistor 234 to switch on, allowing the current flowing through the third LED set 218 in the direction 248 to cause the third LED set 218 to be on. Although the second and third LED sets both emit light only at half of the cycle of the AC current, they appear steadily on to the human eye.

Figure 5:
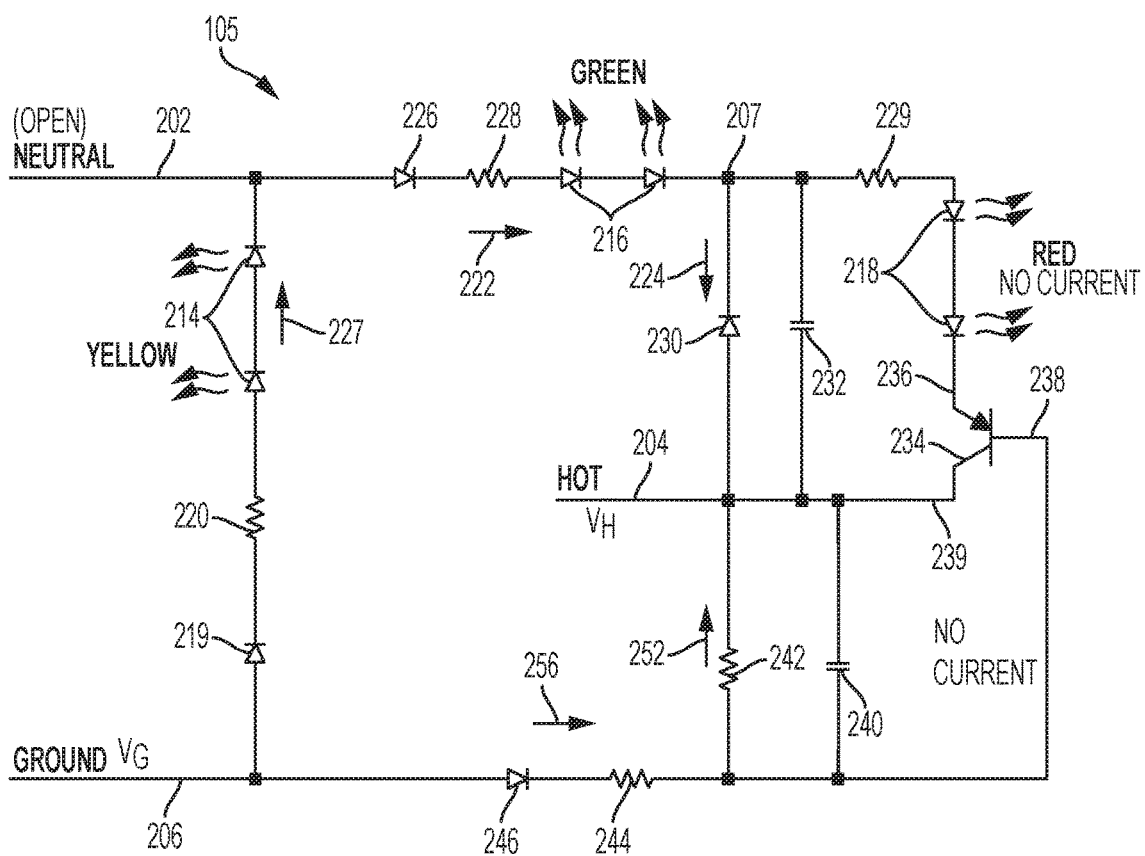
FIG. 5 illustrates features of the example indication interface device in FIGS. 1A-1B when the neutral is open.

In FIG. 5, when the neutral terminal of the connection circuit is not connected, the neutral conductor 202 of the indicator interface device 105 is not connected to the power source either. Depending on which half cycle that the AC current power source is in, the voltage at the hot conductor 204, $V_H$, may be higher or lower than the voltage at the ground conductor 206, $V_G$. When $V_H>V_G$, there will be no current flow from the hot conductor 204 through the first LED set 214 and the second LED set 216 to the ground conductor 206 due to the rectifier 226, 219. There is no current flow through rectifier 246 either.

When $V_H<V_G$, the voltage at the hot conductor 204, $V_H$, becomes the lowest voltage point in the device, which causes current to flow from the ground conductor 206 to the hot conductor 204 in two different paths simultaneously: (1) the first current flow passes through rectifiers 219 and 226, in the first direction 217, the second direction 222 and direction 224, causing both the first LED set 214 and the second LED set 216 to turn on; and (2) the second current flow passes through rectifier 246 in the fourth direction 256, which also causes a current flow through the resistor 242 in a fifth direction 252. Similar to the scenario in FIG. 3, the current flow in 256 causes the transistor 234 to switch off, thus, there is no current flowing through the third LED set 218. This results in the third LED set 218 to be off. As above illustrated, the first and second LED sets emit light only at half of the AC current cycle when $V_H<V_G$, thus, the first and second LED sets appear steadily on, and the third LED set is steadily off.

When the hot terminal is not connected (not shown), the power source is essentially not connected to the connection circuit. Thus, the indicator interface device 105 (in FIGS. 1A-1B) has no power, and all LED sets are off.

Figure 6:
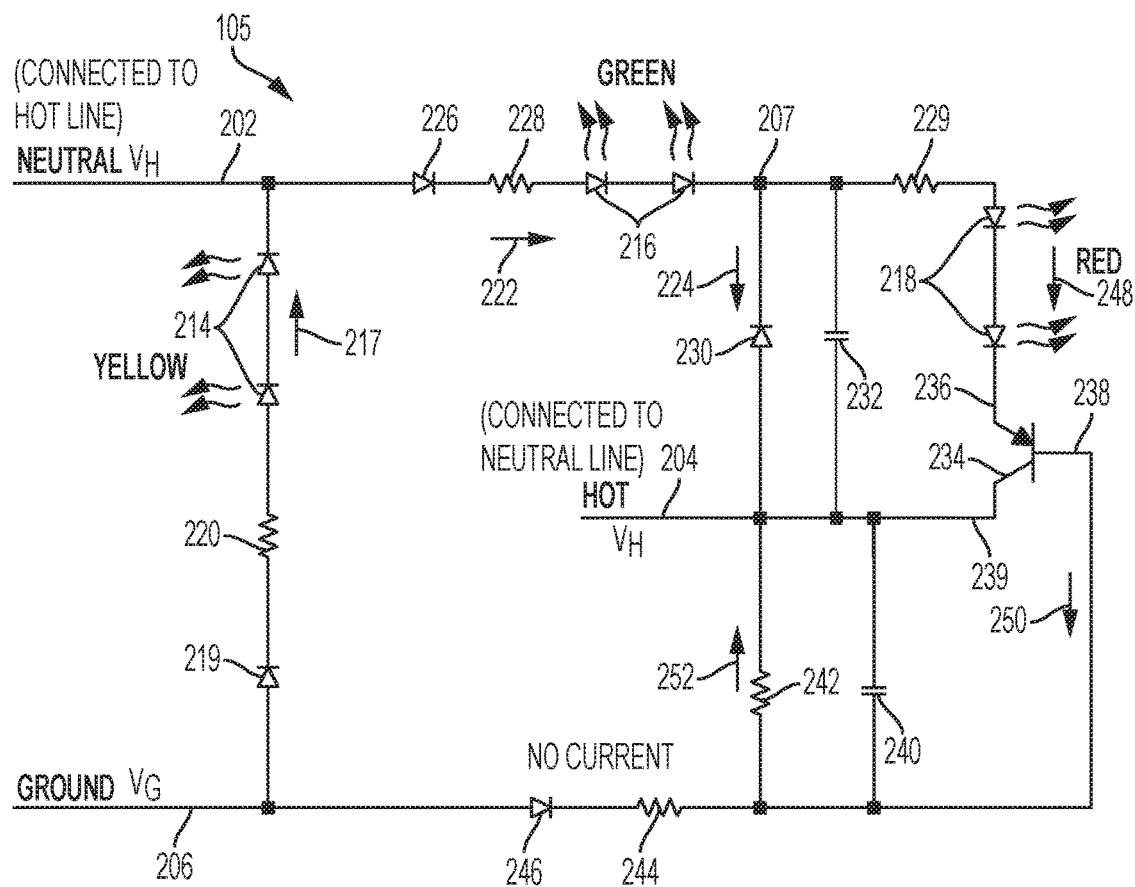
FIG. 6 illustrates features of the example indication interface device in FIGS. 1A-1B when the neutral and hot conductors are interchanged.

In FIG. 6, the neutral conductor 202 is actually connected to the hot line of the power source, and the hot conductor 204 is actually connected to the neutral line of the power source. Let $V_H$ be the voltage of the hot line (connected to the neutral conductor 202), let $V_N$ be the voltage of the neutral line (connected to the hot conductor 204), and let $V_G$ be the voltage of the ground line at the ground conductor 206. When the AC current of the power source reaches a half cycle at which $V_H>V_N$ and $V_H>V_G$, there is no current flowing through the first LED set 214 due to rectifier 219. However, there is a current flowing through the second LED set 216 in direction 222, which causes the second LED set 216 to be on.

The current 222 continues to flow through the Zener diode 230 in the direction 224 to cause a voltage across the Zener diode 230. This voltage across the Zener 230 ranges in less than 10 volts at the connection point 207. There is also no current flowing from the ground conductor 106 (which is connected to the ground of the power source) through rectifier 246. Similar to the scenario in FIG. 4, due to the fact that no current is flowing from the ground conductor 206 to the resistor 242, the current 252 flowing through the resistor 242 comes only from the current 250 flowing from the base 238 of the transistor 234, causing the transistor 234 to switch on. This allows a current flowing through the third LED set 218 in the direction 248, causing the third LED set 218 to be on.

With further reference to FIG. 6, when the AC current of the power source reaches the other half cycle at which $V_H<V_N$ and $V_H<V_G$, there will be no current flowing from the hot conductor 204 (which is connected to the neutral line of the power source) to the neutral conductor 202 (which is connected to the hot line of the power source) due to rectifier 226. However, there is a current flow from the ground conductor 206 to the neutral conductor 202 in direction 217, which causes the first LED set 214 to be on.

When the AC current of the power source alternates direction, the first LED set 214 turns on at one half cycle, and alternatively, the second and third LED sets 216 and 218 turn on at the other half cycle, and thus all of the LED sets 214, 216, 218 appear steadily on to the human eye. In achieving this steady appearance for the third LED set, the capacitor 232 serves to store some energy when $V_H>V_N$, and discharges when $V_H<V_N$. This charging/discharging process helps provide a steady power needed to keep the third LED set on in light of the AC current in the power source.

Figure 7:
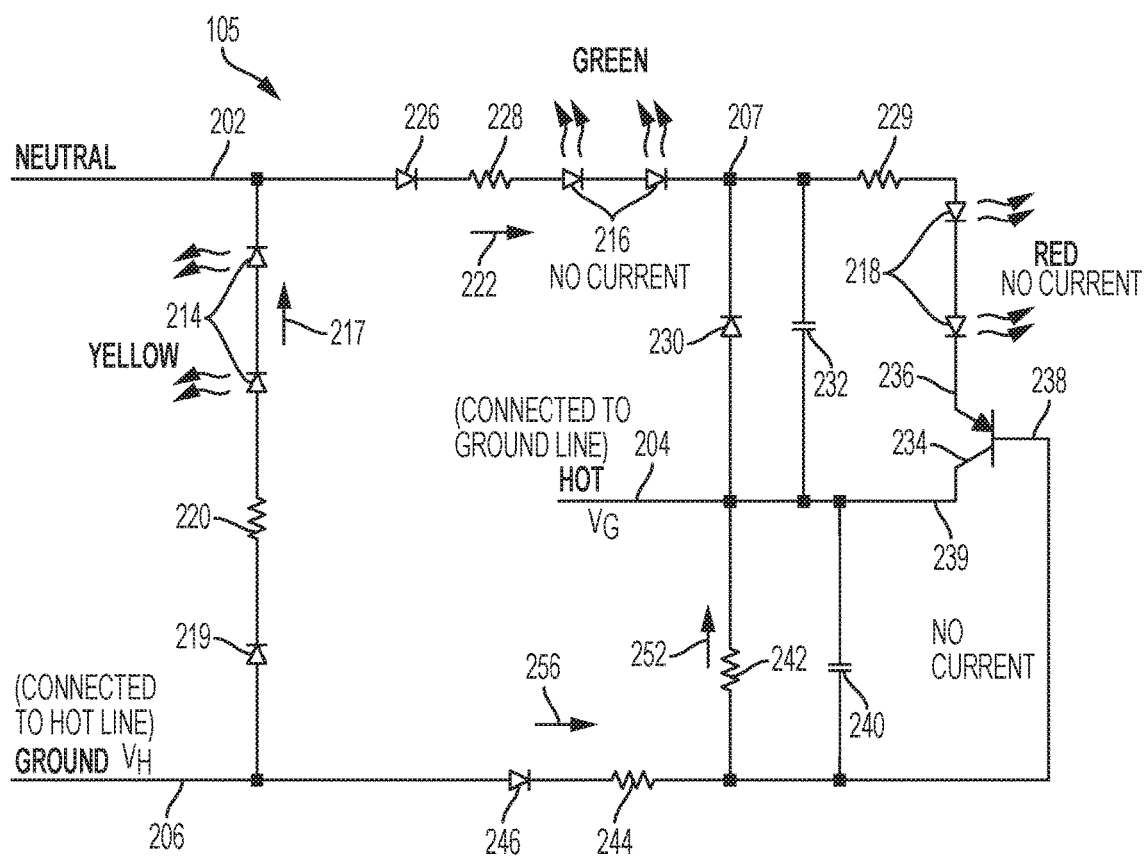
FIG. 7 illustrates features of the example indication interface device in FIGS. 1A-1B when the hot and ground conductors are interchanged.

In FIG. 7, the ground conductor 206 is actually connected to the hot line of the power source, and the hot conductor 204 is actually connected to the ground of the power source. Let $V_H$ be the voltage of the hot line (connected to the ground conductor 206), let $V_G$ be the voltage of the ground line (connected to the hot conductor 204), and let $V_N$ be the voltage of the neutral line at the neutral conductor 202. When the AC current of the power source reaches a half cycle at which $V_H<V_N$ and $V_H<V_G$, there is no current flowing through the first LED set 214 and the second LED set 216 due to rectifiers 226 and 219, respectively. Also, there is no current flowing through rectifier 246.

With further reference to FIG. 7, when the AC current of the power source reaches the other half cycle at which $V_H>V_N$ and $V_H>V_G$, there is a current flowing through the first LED set 214 in direction 217, causing the first LED set 214 to be on. Because the neutral conductor 202 now has the lowest voltage in the circuit, the current flowing through the first LED set in the direction 217 will not continue through the second LED set 216. Further, $V_H>V_G$ will cause a current flowing through rectifier 246 in the direction 256 and continue through the resistor 242. Similar to scenario in FIG. 3, the current 252 flowing through the resistor 242 causes a significant voltage across the resistor 242, which causes the transistor 234 to switch off, causing no current flow through the third LED set 218. Thus, the third LED set 218 is switched off. As described, the first LED set 214 turns on only at half cycle of the AC current, but appears to be on steadily to the human eye. The second and third LED sets 216, 218 are steadily off.

With the above-described configurations, the LEDs of the indicator interface device provide a visual indicator of whether or not the circuit is properly connected. If the circuit is not properly connected, the visual indicator indicates exactly which connections are problematic. Each of the first, second and third LED sets may vary in color, size, shape or be reflected in other ornamental features in order to distinguish visually and serve as a visual indicator. For example, the first, second and third LED sets may include yellow, green and red LEDs, respectively. Alternatively, and/or additionally, each of the first, second and third LED sets may have a different shape. Alternatively, the first, second and third LED sets may have the same color and shape, but differentiate among themselves by their locations on the interface panel. Further, each LED set may include one, two or more LEDs.

The various embodiments described above provide advantages over prior art systems in that the indicator interface device uses LEDs instead of neon bulbs in other systems. Further, the indicator interface devices use only a few simple electrical components to keep the cost of the devices low.

The features and functions described above, as well as alternatives, may be combined into many other different systems or applications. Various alternatives, modifications, variations, combinations or improvements may be made by those skilled in the art, each of which is also intended to be encompassed by the disclosed embodiments.

The invention claimed is:

1. An electronic outlet device, comprising:
 a connection circuit comprising a neutral terminal, a hot terminal and a ground terminal, each terminal connecting to a neutral line of a power source, a hot line of the power source, or ground;
 an interface panel comprising a receptacle connected to the connection circuit and configured to receive a load; and
 an indicator interface device attached to the interface panel, wherein the indicator interface device comprises:
  a neutral conductor, a hot conductor and a ground conductor respectively connected to the neutral terminal, the hot terminal and the ground terminal of the connection circuit,
  a first indicator circuit connected between the neutral conductor and the ground conductor, wherein the first indicator circuit comprises:
   a first light-emitting diode (LED) set comprising one or more LEDs, and
   a first switching circuit configured to cause the one or more LEDs in the first LED set to turn on and off,
  a second indicator circuit connected to the neutral conductor, wherein the second indicator circuit comprises:
   a second LED set comprising one or more LEDs, and
   a second switching circuit configured to cause the one or more LEDs in the second LED set to turn on and off, and
  a third indicator circuit connected between the second indicator circuit and the hot conductor and also connected between the ground conductor and the hot conductor, wherein the third indicator circuit comprises:
   a third LED set comprising one or more LEDs, and
   a third switching circuit configured to cause the one or more LEDs in the third LED set to turn on and off,
  wherein at least one combination of on/off states of the first, second and third LED sets indicates a correct connection or a unique type of error in a connection between the power source and the connection circuit.

2. The device of claim 1, wherein:
 the correct connection comprises the hot terminal, the neutral terminal and the ground terminal of the connection circuit being respectively connected to the hot line, the neutral line and the ground of the power source; and
 the unique type of error in the connection comprises one of the following connections:
  the hot terminal of the connection circuit is open,
  the neutral terminal of the connection circuit is open,
  the ground terminal of the connection circuit is open,
  the hot and ground terminals of the connection circuit are respectively connected to the ground and the hot line of the power source, or
  the hot and neutral terminals of the connection circuit are respectively connected to the neutral and hot lines of the power source.

3. The device of claim 1, wherein:
 the one or more LEDs in the first LED set are connected in series so that a current flow in a first direction from the ground conductor to the neutral conductor will cause the one or more LEDs in the first LED set to emit light; and
 the first switching circuit comprises a rectifier connected to the first LED set in series and configured to limit current flow in the first indicator circuit in the first direction.

4. The device of claim 3, wherein the first switching circuit further comprises a limiter connected to the rectifier in series and configured to limit an amplitude of the current flow in the first indicator circuit to protect the one or more LEDs in the first LED set.

5. The device of claim 1, wherein:
 the one or more LEDs in the second LED set are connected in series so that a current flow in a second direction from the neutral conductor to the hot conductor will cause the one or more LEDs in the second LED set to emit light; and
 the second switching circuit comprises a rectifier connected to the second LED set in series and configured to limit current flow in the second indicator circuit in the second direction.

6. The device of claim 5, wherein the second switching circuit further comprises a limiter connected to the rectifier in series and configured to limit an amplitude of the current flow in the second indicator circuit to protect the one or more LEDs in the second LED set.

7. The device of claim 1, wherein:
 the one or more LEDs in the third LED set are connected in series so that a current flow in a third direction will cause the one or more LEDs in the third LED set to emit light;
 the third switching circuit comprises a voltage regulator and a capacitor connected in parallel; and
 the voltage regulator and the capacitor together are further connected to the third LED set in parallel, and configured to stabilize a voltage across the third LED set when there is a current flow in the third direction in the third indicator circuit.

8. The device of claim 1, wherein the third switching circuit comprises a rectifier connected to the ground conductor to limit a current flow in the third switching circuit in a fourth direction from the ground conductor to the hot conductor.

9. The device of claim 8, wherein the third switching circuit further comprises:
a transistor having a base, a collector and an emitter, with the emitter connected to the third LED set, the collector connected to the hot conductor, and a resistor connected between the collector and the base of the transistor;
whereby the third switching circuit is configured to:
allow the transistor to switch on a current flow through the third LED set when there is no current flow in the fourth direction in the third switching circuit; and
allow the transistor to switch off the current flow through the third LED set when there is a current flow in the fourth direction in the third switching circuit.

10. The device of claim 9, wherein the third switching circuit further comprises a capacitor connected between the collector and base of the transistor to stabilize a voltage between the collector and the base of the transistor.

11. An indicator interface device for testing an electrical outlet, comprising:
a three-prong input pluggable into a receptacle of an electrical outlet that is connected to a power source via a connection circuit, the three-prong input having a neutral conductor, a hot conductor and a ground conductor;
a first indicator circuit connected between the neutral conductor and the ground conductor, wherein the first indicator circuit comprises:
a first light-emitting diode (LED) set comprising one or more LEDs, and
a first switching circuit configured to cause the first LED set to turn on and off;
a second indicator circuit connected to the neutral conductor, wherein the second indicator circuit comprises:
a second LED set comprising one or more LEDs, and
a second switching circuit configured to cause the second LED set to turn on and off; and
a third indicator circuit connected between the second indicator circuit and the hot conductor and also connected between the ground conductor and the hot conductor, wherein the third indicator circuit comprises:
a third LED set comprising one or more LEDs, and
a third switching circuit configured to cause the second LED set to turn on and off;
wherein at least one combination of on/off states of the first, second and third LED sets indicates a correct connection or a unique type of error in a connection between the power source and the connection circuit.

12. The device of claim 11, wherein:
the connection circuit comprises a hot terminal, a neutral terminal and a ground terminal;
the correct connection comprises the hot terminal, the neutral terminal and the ground terminal of the connection circuit being respectively connected to a hot line, a neutral line and ground of the power source; and
the unique type of error in the connection comprises one of the following connections:
the hot terminal of the connection circuit is open,
the neutral terminal of the connection circuit is open,
the ground terminal of the connection circuit is open,
the hot and ground terminals of the connection circuit are respectively connected to the ground and the hot line of the power source, or
the hot and neutral terminals of the connection circuit are respectively connected to the neutral and hot lines of the power source.

13. The device of claim 11, wherein:
the one or more LEDs in the first LED set are connected in series so that a current flow in a first direction from the ground conductor to the neutral conductor will cause the one or more LEDs in the first LED set to emit light; and
the first switching circuit comprises a rectifier connected to the first LED set in series and configured to limit current flow in the first indicator circuit in the first direction.

14. The device of claim 13, wherein the first switching circuit further comprises a limiter connected to the rectifier in series and configured to limit an amplitude of the current flow in the first indicator circuit to protect the one or more LEDs in the first LED set.

15. The device of claim 11, wherein:
the one or more LEDs in the second LED set are connected in series so that a current flow in a second direction from the neutral conductor to the hot conductor will cause the one or more LEDs in the second LED set to emit light; and
the second switching circuit comprises a rectifier connected to the second LED set in series and configured to limit current flow in the second indicator circuit in the second direction.

16. The device of claim 15, wherein the second switching circuit further comprises a limiter connected to the rectifier in series and configured to limit an amplitude of the current flow in the second indicator circuit to protect the one or more LEDs in the second LED set.

17. The device of claim 11, wherein:
the one or more LEDs in the third LED set are connected in series so that a current flow in a third direction will cause the one or more LEDs in the third LED set to emit light;
the third switching circuit comprises a voltage regulator and a capacitor connected in parallel; and
the voltage regulator and the capacitor are together further connected to the third LED set in parallel, and configured to stabilize a voltage across the third LED set when there is a current flow in the third direction in the third indicator circuit.

18. The device of claim 11, wherein the third switching circuit comprises a rectifier connected to the ground conductor to limit a current flow in the third switching circuit in a fourth direction from the ground conductor to the hot conductor.

19. The device of claim 18, wherein the third switching circuit further comprises:
a transistor having a base, a collector and an emitter, with the emitter connected to the third LED set, the collector connected to the hot conductor, and a resistor being connected between the collector and the base of the transistor;
whereby the third switching circuit is configured to:
allow the transistor to switch on a current flow through the third LED set when there is no current flow in the fourth direction in the third switching circuit; and allow the transistor to switch off the current flow through the third LED set when there is a current flow in the fourth direction in the third switching circuit.

20. The device of claim 19, wherein the third switching circuit further comprises a capacitor connected between the collector and base of the transistor to stabilize a voltage between the collector and the base of the transistor.

\* \* \* \* \*